United States Patent
Araki et al.

(10) Patent No.: US 6,525,952 B2
(45) Date of Patent: *Feb. 25, 2003

(54) RECORDING SYSTEM, DATA RECORDING APPARATUS, MEMORY APPARATUS, AND DATA RECORDING METHOD

(75) Inventors: Shigeo Araki, Tokyo (JP); Kenichi Nakanishi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/118,402

(22) Filed: Apr. 8, 2002

(65) Prior Publication Data

US 2002/0110014 A1 Aug. 15, 2002

Related U.S. Application Data

(63) Continuation of application No. 09/806,133, filed as application No. PCT/JP00/05056 on Jul. 28, 2000, now Pat. No. 6,388,908.

(30) Foreign Application Priority Data

Jul. 28, 1999 (JP) ............................................. 11-214088

(51) Int. Cl.$^7$ ................................................ G11C 7/00
(52) U.S. Cl. ................ 365/45; 365/185.11; 365/230.03
(58) Field of Search .............................. 365/45, 185.11, 365/185.17, 230.03; 711/202

(56) References Cited

U.S. PATENT DOCUMENTS 6,262,915 B1 * 7/2001 Kihara et al. .......... 365/185.11

* cited by examiner

Primary Examiner—Vu A. Le
(74) Attorney, Agent, or Firm—Frommer Lawrence & Haug LLP; William S. Frommer

(57) ABSTRACT

Data 30 is recorded into storages 0 to 3 in parallel. Writing sectors are selected from a plurality of clusters so that the sectors are continuously arranged in each cluster, and the data is simultaneously written into the selected sectors. In the case where the sectors numbered in the original order are written into the storages 0 to 3 in parallel, the data of No. 0 is recorded into the head sector in the cluster of the storage 0, the data of No. 16 is recorded into the head sector in the cluster of the storage 1, the data of No. 32 is recorded into the head sector in the cluster of the storage 2, and the data of No. 48 is recorded into the head sector in the cluster of the storage 3, respectively. Thus, the data is arranged in the original order into the cluster constructed in the same storage. When the data is written into a plurality of storages in parallel, the compatibility of the file format of the written data is held.

5 Claims, 12 Drawing Sheets

T:TRANSFER TIME

T:TRANSFER TIME

|  | STORAGE 0 | STORAGE 1 | STORAGE 2 | STORAGE 3 |
|---|---|---|---|---|
| SEGMENT 0 | 0x0000<br>0x0004<br>⋮<br>0x01fc | 0x0001<br>0x0005<br>⋮<br>0x01fd | 0x0002<br>0x0006<br>⋮<br>0x01fe | 0x0003<br>0x0007<br>⋮<br>0x01ff |
| SEGMENT 1 | 0x0200<br>⋮<br>0x03fc | 0x0201<br>⋮<br>0x003fd | 0x0202<br>⋮<br>0x03fe | 0x0203<br>⋮<br>0x03ff |
| SEGMENT 2 | 0x0400<br>⋮<br>0x04fc | 0x0401<br>⋮<br>0x04fd | 0x0402<br>⋮<br>0x04fe | 0x0403<br>⋮<br>0x04ff |
| SEGMENT 3 | 0x0600<br>⋮<br>0x07fc | 0x0601<br>⋮<br>0x07fd | 0x0602<br>⋮<br>0x07fe | 0x0603<br>⋮<br>0x07ff |

| LOGIC ADDRESS | PHYSICAL ADDRESS |
|---|---|
| 0x0200 | 180 |
| 0x0240 | 511 |
|  |  |
| 0x031f | 1 |
|  |  |
| 0x0385 | 0 |

RECORDING SYSTEM, DATA RECORDING APPARATUS, MEMORY APPARATUS, AND DATA RECORDING METHOD

This is a continuation of application Ser. No. 09/806,133, filed Mar. 26, 2001, which is a 371 of PCT/JP00/05056, filed Jul. 28, 2000, now U.S. Pat. No. 6,388,908.

TECHNICAL FIELD

The invention relates to a recording system, a data recording apparatus, a memory apparatus, and a data recording method, in which a memory card which is detachable to/from an apparatus is used as a recording medium.

BACKGROUND ART

According to an electrically rewritable non-volatile memory called EEPROM (Electrically Erasable Programmable ROM), since one bit is constructed by two transistors, an occupation area per bit is large and there is a limitation in case of raising an integration degree. To solve such a problem, a flash memory in which one bit can be realized by one transistor by an all-bit batch erasing method has been developed. The flash memory is expected as a memory which can be substituted for a recording medium such as magnetic disk, optical disk, or the like.

It is known that a memory card having a flash memory is constructed so as to be detachable to/from an apparatus. By using such a memory card, a digital audio recording and reproducing apparatus using the memory card in place of the conventional disk-shaped medium such as CD (Compact Disc), MD (Minidisc), or the like can be realized. Besides audio data, still image data and motion image data can be also recorded into the memory card and it can be used as a recording medium of a digital still camera or a digital video camera.

According to the flash memory, a data unit called a segment is divided into a predetermined number of clusters (fixed length) and one cluster is divided into a predetermined number of sectors (fixed length). The cluster is also called a block. The sector is also called a page. In the flash memory, an erasure is performed in a lump on a cluster unit basis, and the writing or reading operation is performed in a lump on a sector unit basis.

For example, in case of the flash memory of 4 MB (megabytes), as shown in FIG. 12, one segment is divided into 512 clusters. The segment is a unit for managing a predetermined number of clusters. One cluster is divided into 16 sectors. One cluster has a capacity of 8 kB (kilobytes). One sector has a capacity of 512 B. A memory of a capacity of 16 MB can be constructed by using four segments each having a capacity of 4 MB.

As shown in FIG. 13A, logic cluster addresses are allocated to a memory space of 16 MB. The logic cluster address is set to a length of 2 bytes in order to distinguish 512×4= 2048 clusters. In FIG. 13, the logic cluster address is expressed by a hexadecimal number. 0x denotes the hexadecimal notation. A logic address is an address which is logically handled by a data processing apparatus (software). A physical address is added to each cluster in the flash memory. A correspondence relation between the clusters and the physical addresses is unchanged.

According to the flash memory, by rewriting data, an insulating film deteriorates and the number of rewriting times is limited. Therefore, it is necessary to prevent a situation that accesses are repetitively and concentratedly performed to a certain same memory area (cluster). In case of rewriting data in a certain logic address stored in a certain physical address, in a file system of the flash memory, updated data is not rewritten into the same cluster but the updated data is written to an unused cluster. Thus, the correspondence relation between the logic addresses and the physical addresses before the data updating changes after the updating. By performing such a swapping process as mentioned above, the situation that the accesses are repetitively and concentratedly performed to the same cluster is prevented, so that a life of the flash memory can be extended.

Since the logic cluster address is accompanied by the data which has once been written into the cluster, even if physical cluster addresses in which the data before updating and the data after the updating are written are changed, the same address is seen from a file management system and the subsequent accesses can be properly performed. Since the correspondence relation between the logic addresses and the physical addresses is changed by the swapping process, a logical/physical address conversion table showing the correspondence between them is needed. By referring to such a table, the physical cluster address corresponding to the designated logic cluster address is specified, thereby enabling the access to the cluster shown by the specified physical cluster address to be performed.

The logical/physical address conversion table is stored in a memory by the data processing apparatus. If a memory capacity of the data processing apparatus is small, the table can be stored in the flash memory. FIG. 13B shows an example of a logical/physical address conversion table regarding segment 1. As shown in FIG. 13B, in the logical/ physical address conversion table, the physical cluster addresses (2 bytes) are made to correspond to the logic cluster addresses (2 bytes) arranged in the ascending order, respectively. The logical/physical address conversion table is managed every segment and its size increases in accordance with the capacity of the flash memory.

There is a case where it is desirable to set a data writing speed to be higher than the ordinary one by making a plurality of storages of the flash memory operative in parallel. For example, an electronic music distribution EMD for distributing music data through a network is being put into practical use. The distributed music data is stored into a hard disk of a personal computer, data of a desired music piece is copied or moved into a memory card by the personal computer, and the memory card is attached into a portable recorder, so that the user can easily listen to the desired music at a place other than his home. Data of a plurality of music pieces is downloaded into the memory card from the hard disk by a parallel writing operation (at a high speed) and, upon reproduction, the music data is read out from the memory card at a normal speed.

FIG. 14 shows a construction of a conventional logic address for four storages. In he example of the diagram, address spaces in the memory are expressed by 11 bits of A0, A1, . . . , and A10. A0 denotes the LSB (least significant bit) and A10 indicates the MSB (most significant bit). The storages each having a capacity of 4 MB are switched by the MSB (A10) and the second MSB (A9). Addresses of 9 bits of A0 to A8 are allocated to a sector and a segment in each storage.

When data is written, the operation is executed at a timing as shown in FIG. 15. First, the data is transferred from the host side to a page buffer of a sector size. Time T is required to transfer. In a next write busy period, the data is transferred from the page buffer into a flash buffer in the flash memory and the data is written into the storage.

Upon reading, as shown in FIG. 16, the data is read out from the flash memory for a read busy period. The read-out data is transferred to a page buffer of a sector size. In the next transfer time T, the data is transferred from the page buffer to the host side.

FIG. 17 is a flowchart showing a flow of processes in case of writing data into continuous logic sectors 0 to 3 belonging to different clusters in a certain segment. In first step S11, a logical/physical conversion table is formed with respect to a segment as a target to be written. In step S12, sector 0 is sent from the host side. The time T is required for this transfer. In step S13, sector 0 is written into the flash memory. In step S14, sector 1 is sent from the host side. In step S15, sector 1 is written into the flash memory. Processes for sending of sector 2 (step S16), writing of sector 2 (step S17), sending of sector 3 (step S18), and writing of sector 3 (step S19) are sequentially performed. Hitherto, for example, even if four storages are provided in parallel, since accesses are concentrated to one storage, a high processing speed cannot be realized.

As for a data construction of one sector on the flash memory, as shown in FIG. 18, an area having a length of 16 bytes in which management information is recorded is added to data of 512 bytes. The management information comprises a logic cluster number, cluster management information, and attribute information. The cluster management information is set to the same information among all sectors in a certain cluster and includes information indicative of valid/invalid of the cluster or the like. The attribute information is information of every sector and includes copyright information or the like. For example, when the flash memory is attached into the apparatus, the host side reads the management information and forms a table of the logic cluster and the physical cluster with respect to the segment.

In case of performing the writing operation into the memory in parallel, generally, the input data is converted into parallel data and the parallel data is simultaneously written into the memory. Since the writing/reading operations into/from the flash memory are performed on a sector unit basis, the data of a plurality of sectors is converted into parallel data. In FIG. 19, reference numeral 50 denotes data such as an audio file or the like. It is now assumed that a size of data 50 of one file coincides with a data amount of four clusters. The data 50 as much as 512 bytes is written into each sector in the flash memory. For example, the data as much as four continuous head sectors 0, 1, 2, and 3 is simultaneously written into the sectors in the storages 0 to 3.

As shown in FIG. 19, if the data of four continuous sectors in the data file 50 is recorded in parallel so as to be distributed into the storages, a format different from the existing file format such that one cluster is arranged in the same storage occurs. That is, according to the conventional file format, a group of 16 sectors in each storage is handled as a cluster and the data is erased on a cluster unit basis. In the flash memory recorded by the method of FIG. 19, on the other hand, in order to erase the data of 16 continuous sectors, the cluster constructed by four sectors of each of the four storages has to be erased. Thus, the erasing area and one or a plurality of cluster areas do not coincide and a compatibility with the existing flash memory is lost with respect to the file format.

It is, therefore, an object of the invention to provide a recording system, a data recording apparatus, a memory apparatus, and a data recording method, in which when performance upon writing is improved by the parallel writing, a compatibility of a file format with that of a conventional non-volatile memory can be held.

Disclosure of Invention

To solve the above problem, according to the invention of claim 1, there is provided a recording system having a detachable memory apparatus with a non-volatile memory constructed by a plurality of clusters each consisting of a plurality of sectors and a data recording apparatus for recording data constructed by a plurality of continuous sectors into the memory apparatus, comprising:

address designating means for designating an address of the sector for recording the data; and recording means for recording the data into the sector designated by the address designating means, wherein the address designating means can designate a plurality of sector addresses in the plurality of clusters and designates the addresses so that the continuous sectors of the recording data are recorded as continuous sectors in the cluster, and the recording means can simultaneously record the data into the plurality of sectors.

According to the invention of claim 2, there is provided a data recording apparatus using a detachable memory apparatus including a non-volatile memory as a recording medium, comprising:

address designating means for recording data in a plurality of sectors into the memory apparatus in parallel, wherein the address designating means can designate a plurality of sector addresses in a plurality of clusters and designates the addresses so that the continuous sectors of the recording data are recorded as sectors which are continuous in the cluster.

According to the invention of claim 3, there is provided a memory apparatus which is detachable to/from a data recording apparatus, comprising:

a non-volatile memory;

recording means for recording data; and interface means arranged among the data recording apparatus, the non-volatile memory, and security means, wherein the recording means can simultaneously record the data into a plurality of sectors so that the continuous sectors of the recording data are recorded as sectors which are continuous in a cluster.

According to the invention of claim 1, there is provided a data recording apparatus for recording data existing in a plurality of clusters each consisting of a plurality of sectors into a plurality of storages in parallel, comprising the steps of:

selecting a writing sector from the plurality of clusters so that the sectors are continuously arranged in each cluster after completion of parallel writing processes; and recording the plurality of selected writing sectors in parallel.

According to the invention, by writing the data in parallel, the clusters are constructed on the same storage. Therefore, a compatibility of a file format with that of the existing memory apparatus can be held.

BEST MODE FOR CARRYING OUT THE INVENTION

Figure 1:
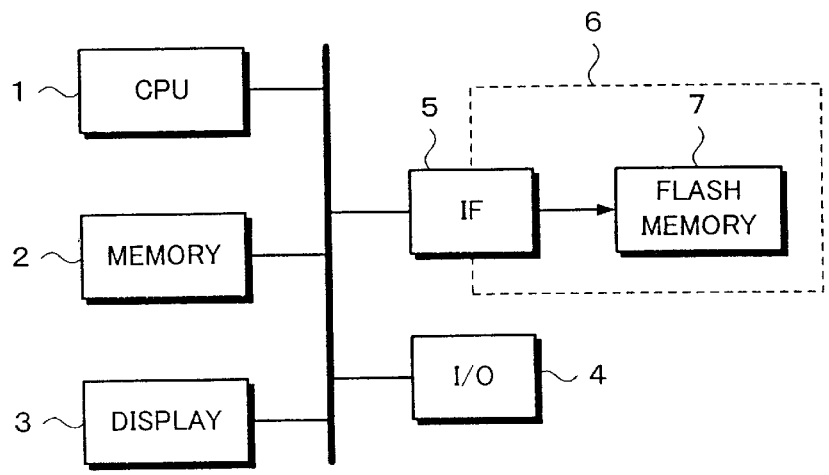
FIG. 1 is a block diagram showing a whole construction of an embodiment of the invention.

An embodiment of the invention will now be described hereinbelow. FIG. 1 shows a construction of a system to which the invention can be applied. In the system, a data processing apparatus on the host side and a memory card are connected via a serial interface. In FIG. 1, reference numeral 1 denotes a CPU. A memory 2, a display 3, and an input/output unit 4 are connected to a bus of the CPU 1.

A serial interface 5 is arranged between the CPU bus and a memory card 6 surrounded by a broken line. The memory 2 includes an ROM for storing a program and an RAM which is used as a work area. Specifically speaking, the data processing apparatus is a personal computer, a digital still camera, a digital video camera, a digital audio recorder, or the like. The memory card 6 has a flash memory 7. The flash memory 7 is, for example, an NAND type flash memory (non-volatile memory). There is also a case where an enciphering circuit is assembled in the memory card 6 for the purpose of protection of copyright of contents which are stored.

The invention can be also applied to a case where the transmission and reception of data between the data processing apparatus and the memory card 6 are executed by a parallel interface instead of the serial interface.

Figures 13A, 13B:
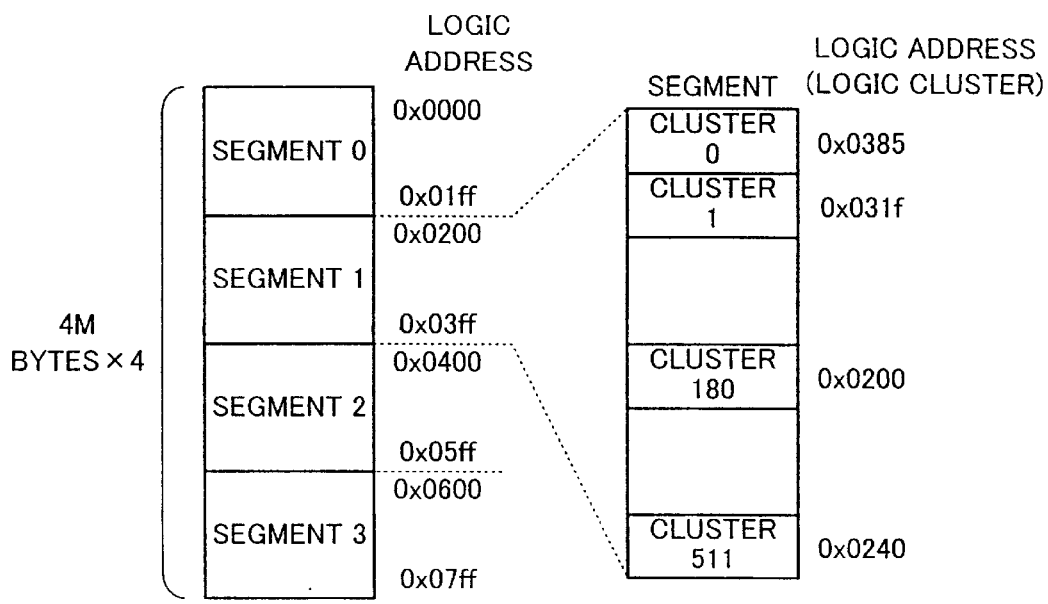
FIGS. 13A and 13B are schematic diagrams showing an example of a logical/physical address conversion table in the flash memory to which the invention can be applied.
Figure 14:
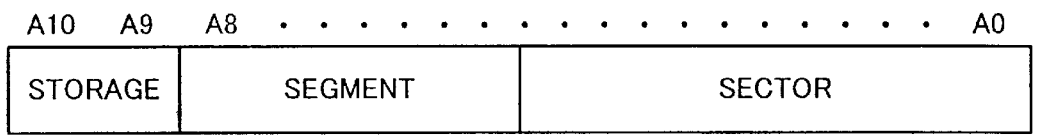
FIG. 14 is a schematic diagram for explaining a conventional address construction.

The flash memory 7 is a memory having a capacity of, for example, 4 MB×4=16 MB. As mentioned with reference to FIG. 12, in case of the flash memory of 4 MB (megabytes), one segment is divided into 512 clusters and one cluster is divided into 16 sectors. One cluster has a capacity of 8 kB (kbytes) and one sector has a capacity of 512 B. As described with reference to FIG. 13A, the logic cluster addresses are allocated into the memory space of 16 MB. As described with reference to FIG. 13B, the logical/physical address conversion table showing the correspondence relation between the logic cluster addresses and the physical cluster addresses is formed on a segment unit basis. Further, as mentioned above, the physical cluster addresses of 11 bits of A0, A1, . . . , and A10 are used for the flash memory of 4 MB×4=16 MB.

Figure 2:
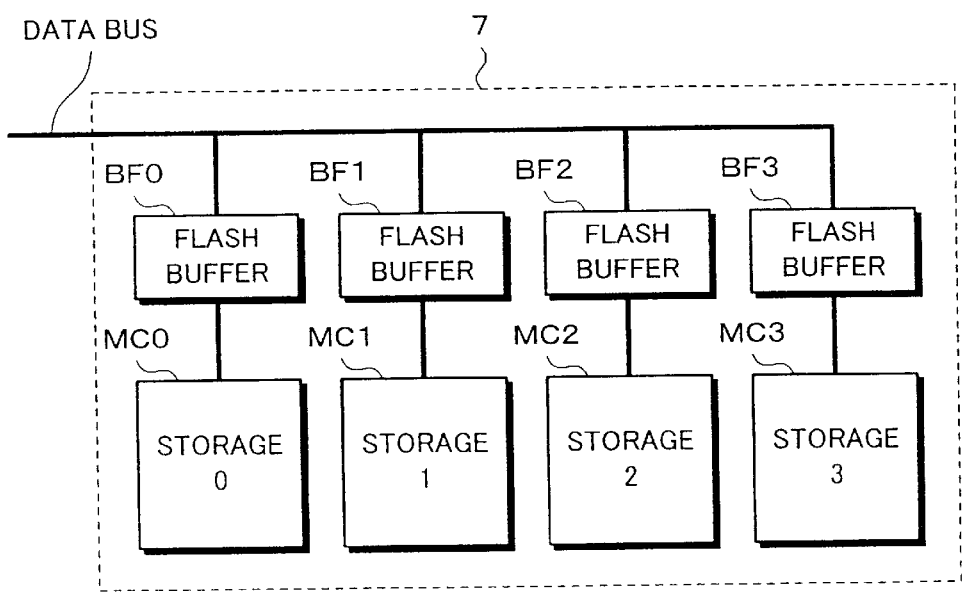
FIG. 2 is a block diagram schematically showing a construction of a memory card in the embodiment of the invention.

As shown in FIG. 2, the parallel writing can be performed for the flash memory 7. FIG. 2 shows only the portion regarding the data input/output for simplicity of explanation. Four corresponding memory cells MC0 to MC3 are provided for storages 0 to 3, respectively. Data is supplied to the memory cells MC0 to MC3 through the data bus and flash buffers BF0 to BF3, respectively. That is, when the write data of one page is accumulated into each of the flash buffers BF0 to BF3 through the data bus, the data is simultaneously transferred from the flash buffers BF0 to BF3 to the memory cells MC0 to MC3. Although FIG. 2 shows an example in which one IC package has four storages, four flash memories of different packages can be also used. Further, a plurality of flash memories each having a plurality of storages in a package can be also combined.

Figure 3:
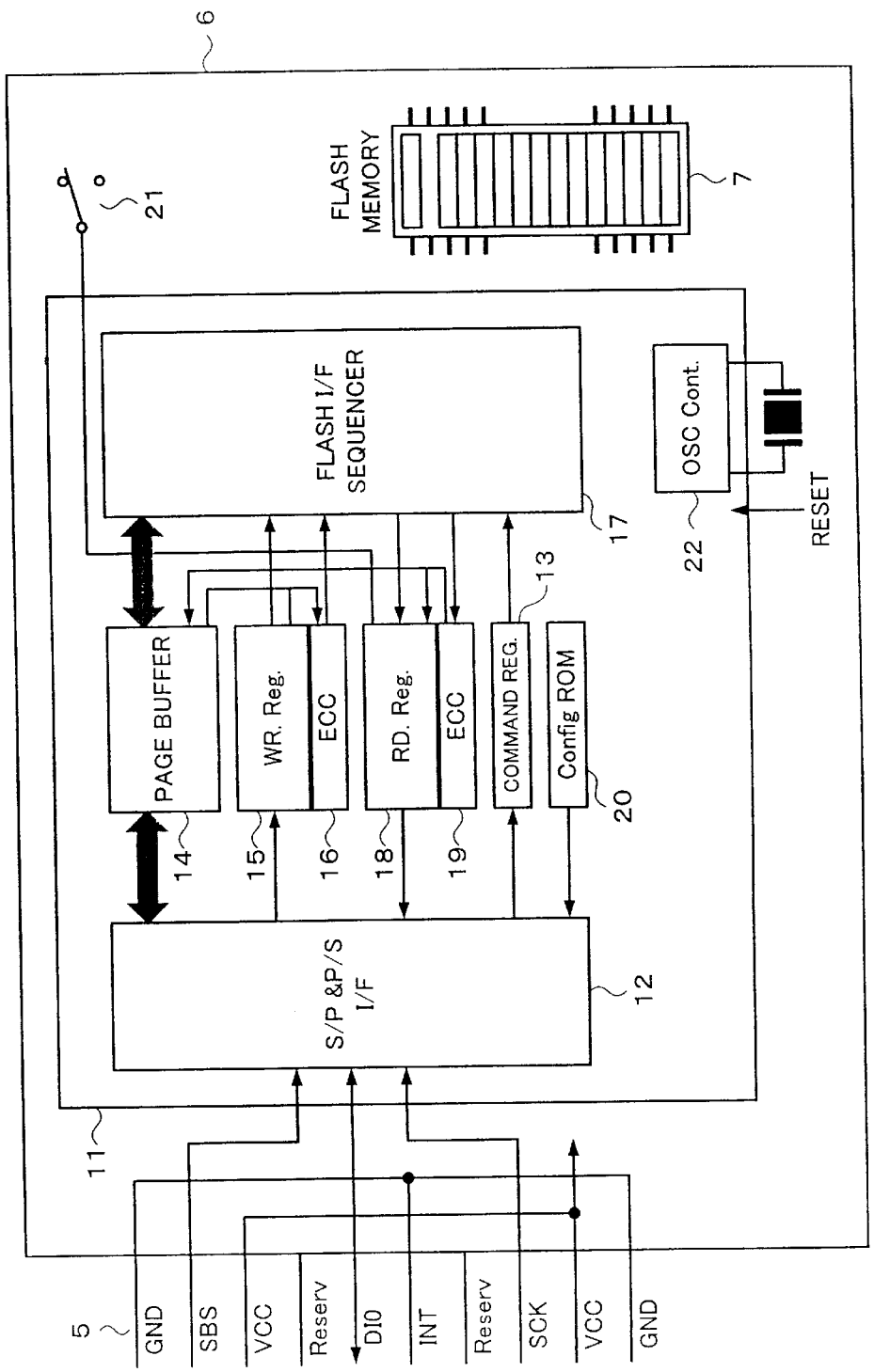
FIG. 3 is a block diagram showing a more detailed construction of the memory card in the embodiment of the invention.

FIG. 3 shows a more specific construction of the memory card 6 to which the invention can be applied. The memory card 6 is formed by constructing a control block 11 and the flash memory 7 as one chip IC. The bidirectional serial interface 5 between the CPU 1 of the data processing apparatus and the memory card 6 comprises ten lines. Four main lines are a clock line SCK for transmitting a clock upon data transmission, a status line SBS for transmitting a status, a data line DIO for transmitting data, and an interruption line INT. Two GND lines and two VCC lines are provided as other power supplying lines. Two lines Reserv are undefined lines.

The clock line SCK is the line for transmitting the clock synchronized with the data. The status line SBS is the line for transmitting a signal indicative of the status of the memory card 6. The data line DIO is the line for inputting and outputting a command and enciphered audio data. The interruption line INT is the line for transmitting an interruption signal for requesting an interruption to the CPU 1 of the data processing apparatus from the memory card 6. The interruption signal is generated when the memory card 6 is attached. In the embodiment, however, since the interruption signal is transmitted through the data line DIO, the interruption line INT is connected to the ground and is not used.

A serial/parallel conversion, parallel/serial conversion, and interface cluster (hereinafter, abbreviated to an S/P, P/S, I/F cluster) 12 in the control block 11 is connected to the interface 5. The S/P, P/S, I/F block 12 converts the serial data received from the data processing apparatus into parallel data, fetches it into the control block 11, converts the parallel data from the control block 11 into the serial data, and sends it to the data processing apparatus.

In a format by which data is transmitted through the data line DIO, a command is first transmitted and, thereafter, data is transmitted. The S/P, P/S, I/F block 12 stores the command into a command register 13 and stores the data into a page buffer 14 and a write register 15. An error correction encoding circuit 16 is provided in association with the write register 15. The error correction encoding circuit 16 forms a redundancy code of an error correction code to the data temporarily stored in the page buffer 14.

The output data of the command register 13, page buffer 14, write register 15, and error correction encoding circuit 15 is supplied to a flash memory interface and sequencer (abbreviated to a memory I/F, sequencer) 17. The memory I/F, sequencer 17 is an interface between the control block 11 and flash memory 7 and controls the transmission and reception of the data between them. The data is written into the flash memory 7 through the memory I/F, sequencer 17.

The data read out from the flash memory 7 is supplied to the page buffer 14, a read register 18, and an error correcting circuit 19 through the memory I/F, sequencer 17. The data stored in the page buffer 14 is error corrected by the error correcting circuit 19. The error corrected outputs of the page buffer 14 and read register 18 are supplied to the S/P, P/S, I/F block 12 and supplied to the CPU 1 of the data processing apparatus through the serial interface 5.

Reference numeral 20 denotes a configuration ROM in which version information, various attribute information, and the like of the memory card 6 have been stored. A switch 21 for prevention of erroneous erasure which can be operated by the user as necessary is provided for the memory card 6. When the switch 21 is in a connecting state of erasure inhibition, even if a command to instruct the erasure of the flash memory 7 is sent from the data processing apparatus side, the erasure of the flash memory 7 is inhibited. Hi Further, reference numeral 22 denotes an oscillator for generating a clock serving as a reference for timing of the process of the memory card 6.

The serial interface between the data processing apparatus and memory card 6 in the embodiment of the invention will be described further in detail. When the data is read out from the memory card 6, a read command is transmitted to the memory card 6 from the data processing apparatus and the memory card 6 receives the read command. After completion of the transmission of the command, the memory card 6.executes a process for reading out the data in the address designated by the received read command from the flash memory 7. While this process is being executed, a busy signal (high level) is transmitted to the data processing apparatus through the data line DIO. After completion of the reading of the data from the flash memory 7, the output of the busy signal is stopped and an output of a ready signal (low level) showing the completion of preparation for sending the data from the memory card 6 to the data processing apparatus is started.

By receiving the ready signal from the memory card 6, the data processing apparatus knows a fact that the process corresponding to the read command has been ready. The memory card 6 outputs the data read out to the page buffer to the data processing apparatus through the data line DIO. The status in which each of the above processes is executed is shown by a level change of the status line SBS.

When the data is written into the flash memory 7 of the memory card, a write command is transmitted from the data processing apparatus to the memory card 6 via the data line DIO. A write address is transmitted in association with the write command. Although the writing and reading operations of the data are performed on a sector unit basis in the flash memory 7, the file is managed on a cluster unit basis in the data processing apparatus and addresses from the data processing apparatus are based on a cluster unit. Subsequently, the data processing apparatus transmits the write data to the memory card 6 through the data line DIO. In the memory card 6, the received write data is accumulated into the page buffer. When the transmission of the write data is finished, the memory card 6 executes a process for writing the write data into the flash memory 7. A busy signal is outputted during the writing process. When the writing process of the write data is finished in the memory card 6, the output of the busy signal is stopped and the ready signal (low level) is transmitted to the data processing apparatus.

In case of performing the parallel writing operation via the serial interface, a command, an address, and data for writing into the storage 0 are transmitted and, thereafter, in a state where the busy signal is at the high level, a command, an address, and data for writing into the storage 1, a command, an address, and data for writing into the storage 2, and a command, an address, and data for writing into the storage 3 are sequentially transmitted. The command, address, and data for writing into the storage 0 are again transmitted. At this time point, the previous writing process of the data into the storage 0 has been finished and the busy signal is at the low level. The parallel writing can be performed by repeating such an operation. The commands, addresses, and data can be also simultaneously transmitted by a method of using four serial interfaces in parallel.

Figure 4:
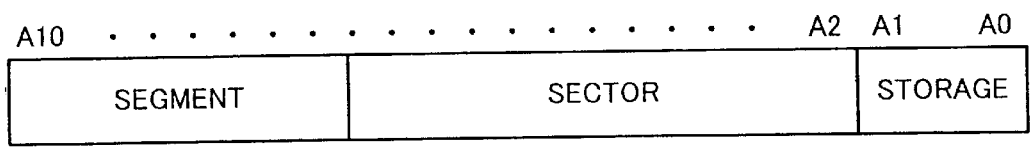
FIG. 4 is a schematic diagram for explaining an address construction in the embodiment of the invention.

The above embodiment of the invention will be described further in detail. FIG. 4 shows a construction of the address in the embodiment. Address spaces in the memory are shown by 11 bits of A0, A1, . . . , and A10. A0 indicates the LSB (least significant bit) and A10 indicates the MSB (most significant bit). The storages each having a capacity of 4 MB are switched by the LSB (A0) and the second LSB (A1). The addresses of 9 bits of A2 to A10 are allocated to the sectors and segments in the respective storages.

Figure 5:
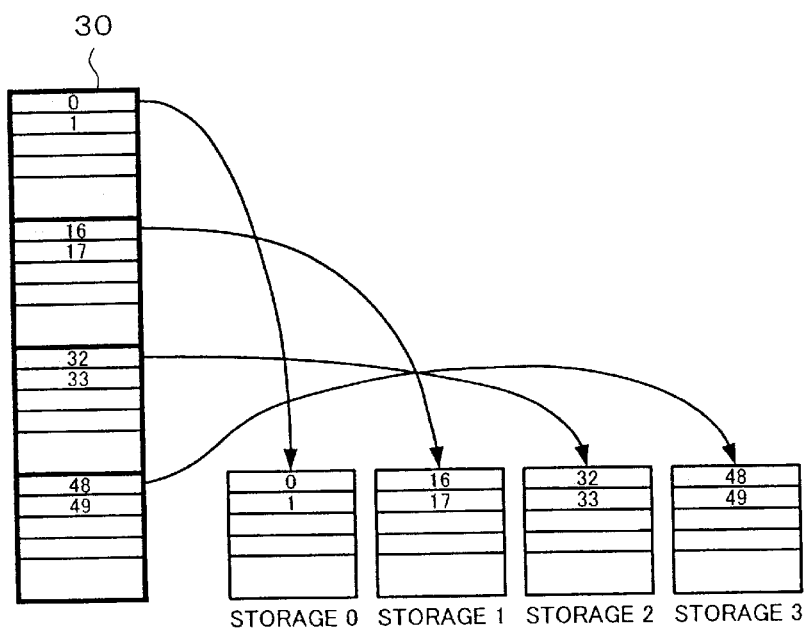
FIG. 5 is a schematic diagram for explaining the parallel writing operation in the embodiment of the invention.

FIG. 5 is a diagram for explaining a file managing method in the system of FIG. 1 using the memory card 6 as a storing medium. In FIG. 5, reference numeral 30 denotes data in a data file, for example, in a compressed audio data file. As for the compressed audio data, usually, a file is formed every music piece and the file is recorded into the flash memory 7 in the memory card 6 on a sector unit basis and read out from the flash memory 7.

In case of recording such data 30 into the flash memory 7 in parallel, as shown in FIG. 5, writing sectors are selected from a plurality of clusters so that the sectors are continuously arranged in each cluster after the writing process and the data is simultaneously written into the selected sectors. Now, assuming that the size of data 30 coincides with four clusters, the data 30 is recorded into the four clusters in the flash memory 7.

As shown in FIG. 5, the data is recorded so that the sectors are arranged in each cluster in each storage in the original order after the writing. For example, in the case where the sectors numbered as 0, 1, 2, 3, . . . in the original order are written into the storages 0 to 3 in parallel, the data of No. 0 is recorded into the head sector in the cluster in the storage 0, the data of No. 16 is recorded into the head sector in the cluster in the storage 1, the data of No. 32 is recorded into the head sector in the cluster in the storage 2, and the data of No. 48 is recorded into the head sector in the cluster in the storage 3, respectively.

As mentioned above, when the data is numbered every sector, four data units of the numbers having offsets of the number which is equal to the number of sectors of the cluster are converted into parallel data and simultaneously written into four storages. Thus, in each storage in the flash memory 7, the data is arranged in the original order into the cluster constructed in the same storage in a manner similar to that of the existing flash memory. Therefore, the compatibility with the file format of the existing flash memory is held.

The data is sequentially read out every cluster from the flash memory recorded as mentioned above. For example, the data is sequentially read out from the head sector of the cluster in the storage 0 in FIG. 5. Subsequently, the data is sequentially read out from the head sector of the cluster in the storage 1. In this manner, the data is sequentially read out from the cluster in the storage 2 and the cluster in the storage 3. The order of the read-out data is the same as the original order. The erasing operation is performed on a cluster unit basis constructed every storage.

As mentioned above, according to the data arrangement after the parallel writing in the embodiment, the cluster is constructed in the same storage in a manner similar to the existing flash memory. Therefore, the compatibility of the file format with that of the existing flash memory can be held.

Figure 6:
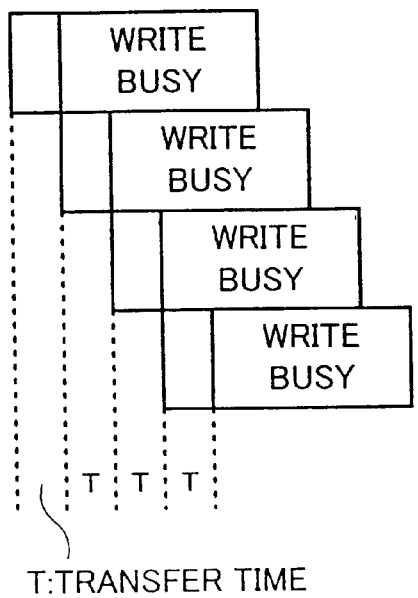
FIG. 6 is a timing chart for explaining the writing operation in the embodiment of the invention.
Figure 15:
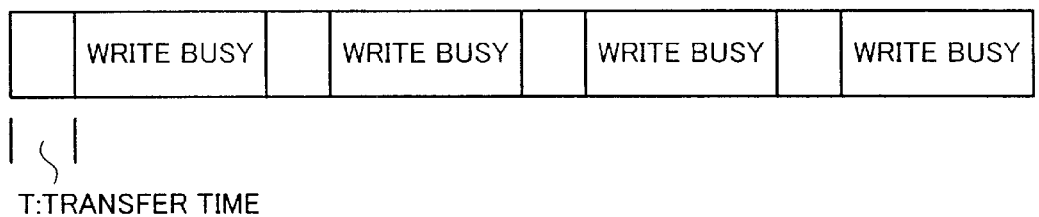
FIG. 15 is a timing chart for explaining the conventional writing operation.

FIG. 6 shows the writing operation in the embodiment. Data is first transferred from the host side to the page buffer of the sector size. Further, the data is transferred from the page buffer into the flash buffer BF0 of the storage 0. The time T is required to transfer. For the next write busy period, the data is written from the flash buffer BF0 into the storage 0. After the first transfer period T, the data of the next sector is transferred and written into the storage 1 for the write busy period. Since the writing operation into the storages 0 to 3 is performed in parallel as mentioned above, the writing speed higher than that in the conventional writing operation shown in FIG. 15 is accomplished.

Figure 7:
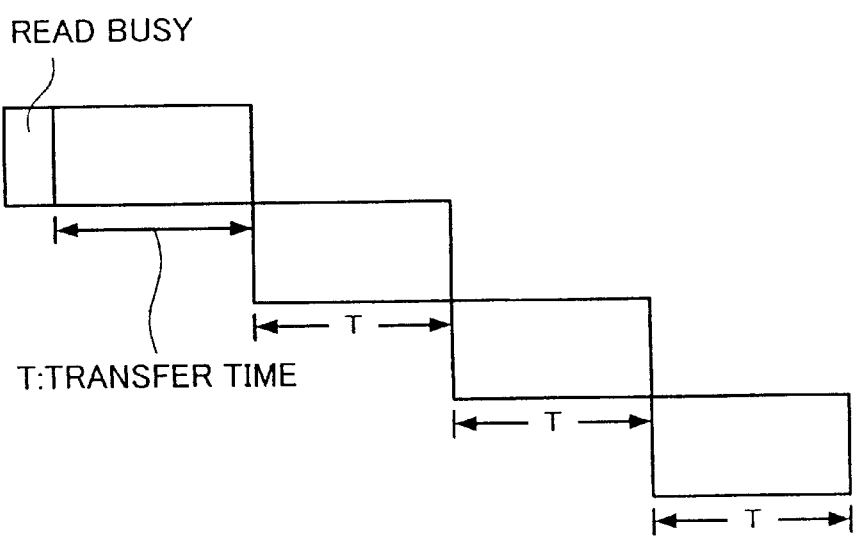
FIG. 7 is a timing chart for explaining the reading operation in the embodiment of the invention.
Figure 16:
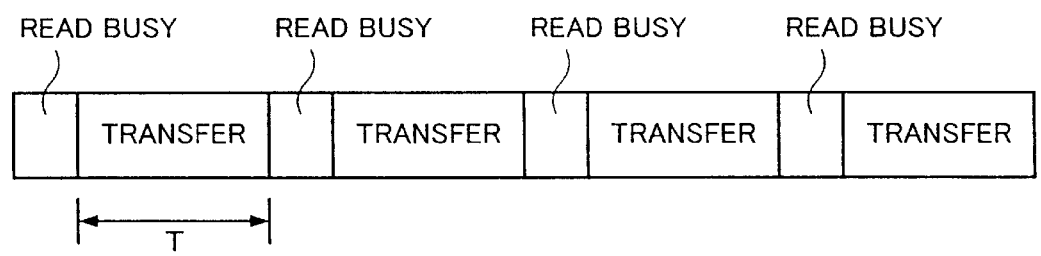
FIG. 16 is a timing chart for explaining the conventional reading operation.
Figure 17:
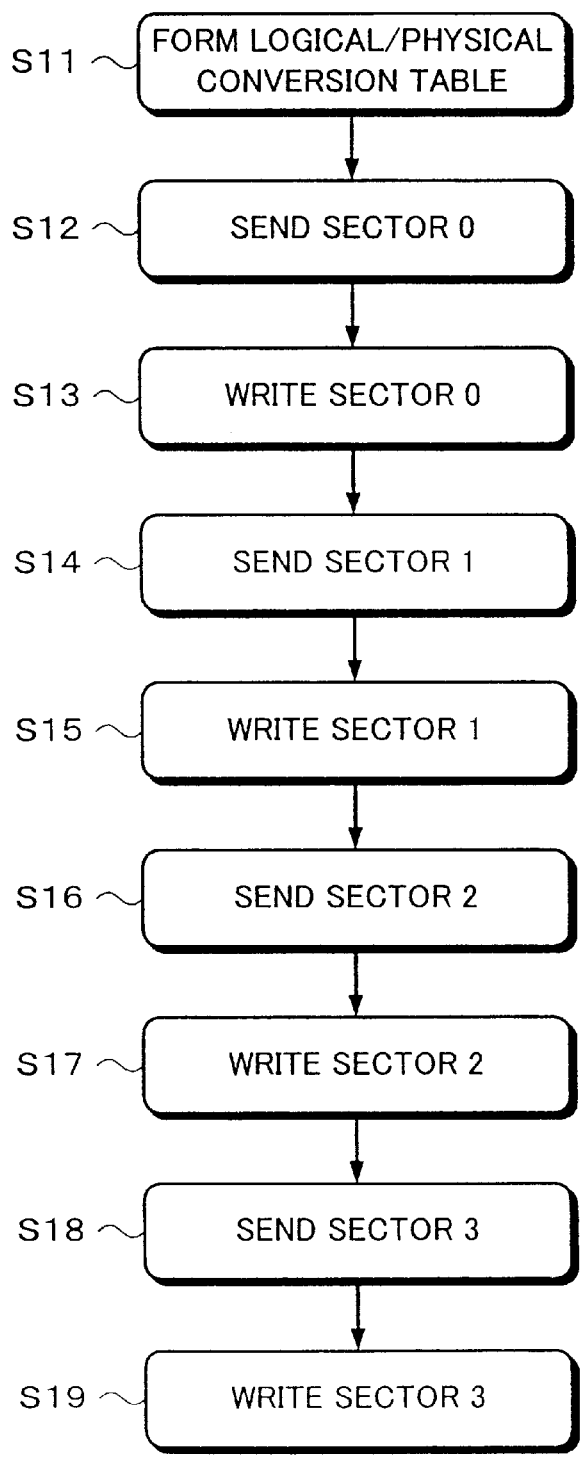
FIG. 17 is a flowchart for explaining the conventional writing operation.
Figure 18:
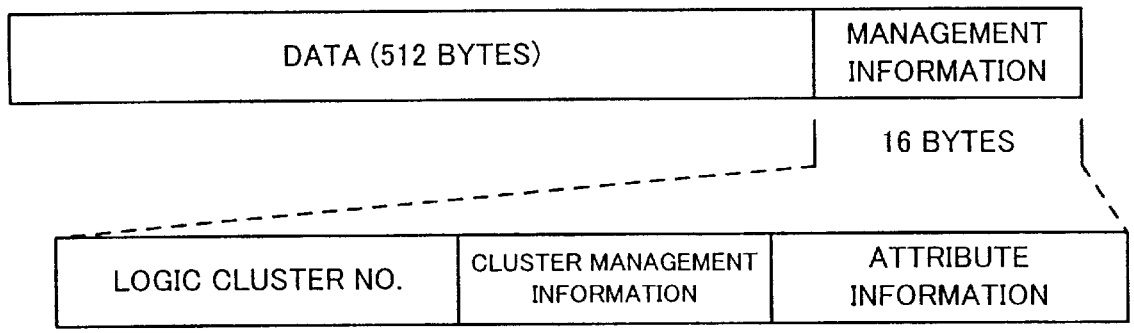
FIG. 18 is a schematic diagram for explaining a sector construction and management information.
Figure 19:
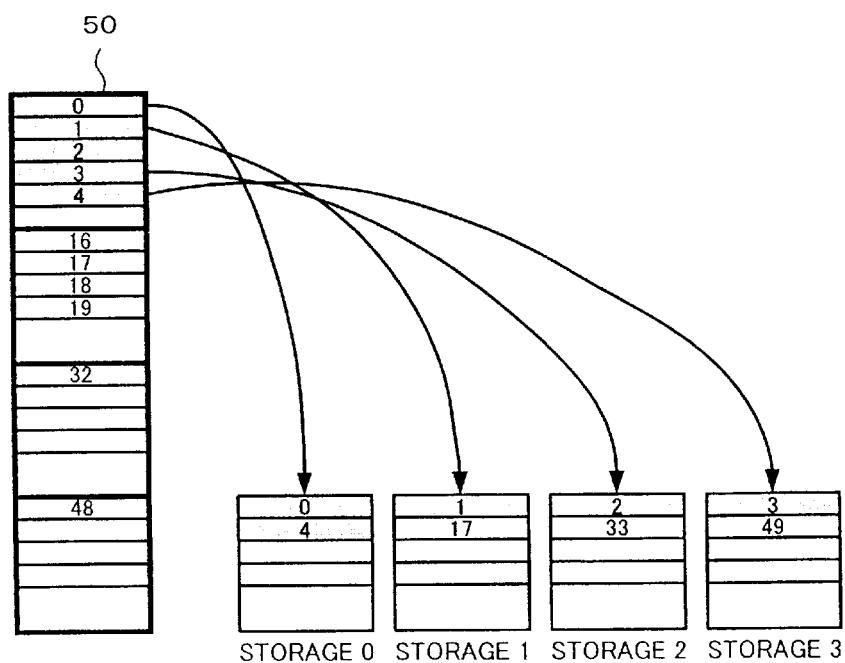
FIG. 19 is a schematic diagram for explaining the conventional parallel writing operation.

Upon reading, as shown in FIG. 7, for a read busy period, the data is read out from each of the storages 0 to 3 and the read-out data is transferred to the flash buffers BF0 to BF3 of the sector size. At the next transfer time T, the data is transferred from the flash buffer BF0 to the page buffer and, further, the data is transferred from the page buffer to the host side. Subsequently, the data is sequentially outputted from the flash buffers BF1, BF2, and BF3 to the page buffers and the data is transferred from the page buffers to the host side. The reading speed higher than that in the process of the conventional reading operation in which the read busy operations are sequentially performed (FIG. 16) is accomplished.

Figure 8:
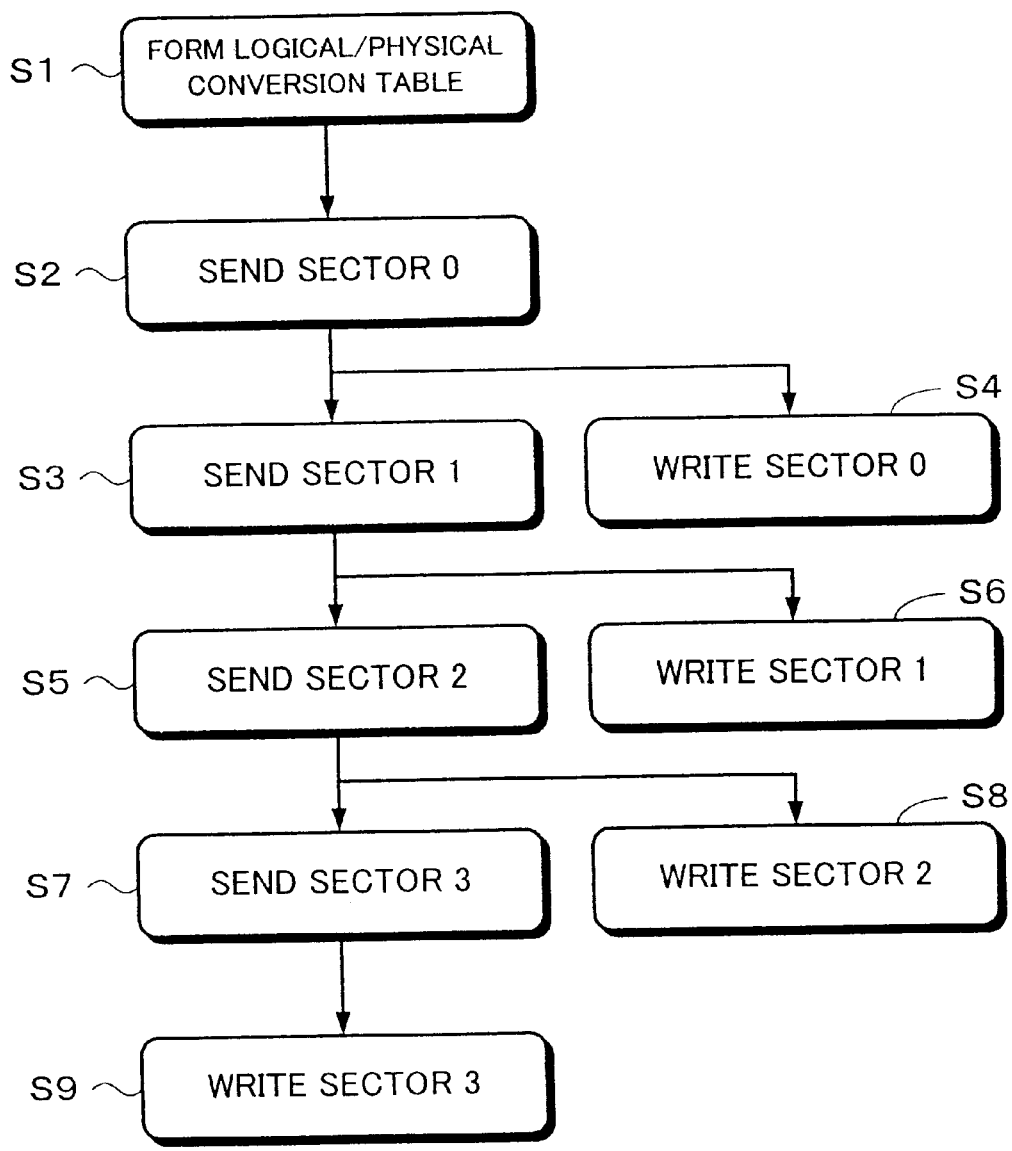
FIG. 8 is a flowchart for explaining the writing operation in the embodiment of the invention.

FIG. 8 is a flowchart showing a flow for processes in case of writing data into continuous logic sectors 0 to 3 belonging to different clusters in a certain segment. In first step SI, a logical/physical conversion table is formed with respect to a segment as a target to be written. In step S2, sector 0 is sent from the host side to the page buffer and the data in sector 0 is transferred from the page buffer to the flash buffer. The time T is required to transfer. In next step S3, in parallel with the sending of sector 1, sector 0 is written into one storage in the flash memory in step S4.

In step S5, sector 2 is sent. In step S6, sector 1 is written into one storage in the flash memory in parallel. Subsequently, processes for sending of sector 3 (step S7), writing of sector 2 (step S8), and writing of sector 3 (step S9) are similarly performed. According to the embodiment of the invention, the situation such that the accesses are concentrated to one storage as in the conventional apparatus does not occur, and the segments are not switched.

Therefore, since there is no need to form the logical/physical conversion table, the high processing speed can be realized.

Figure 9:
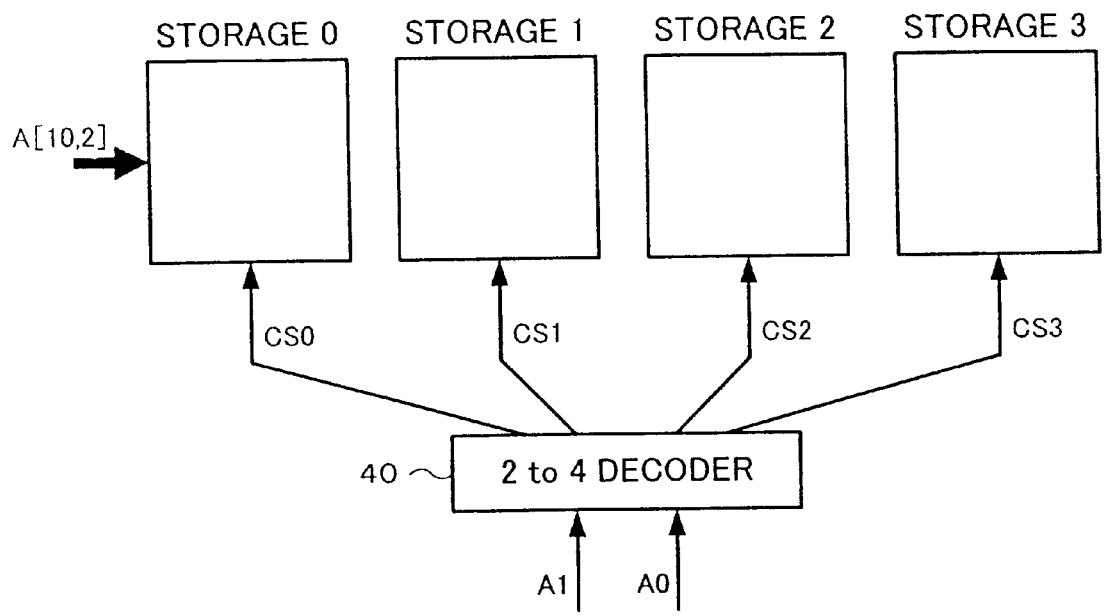
FIG. 9 is a block diagram for explaining the switching of storages in the embodiment of the invention.
Figure 10:
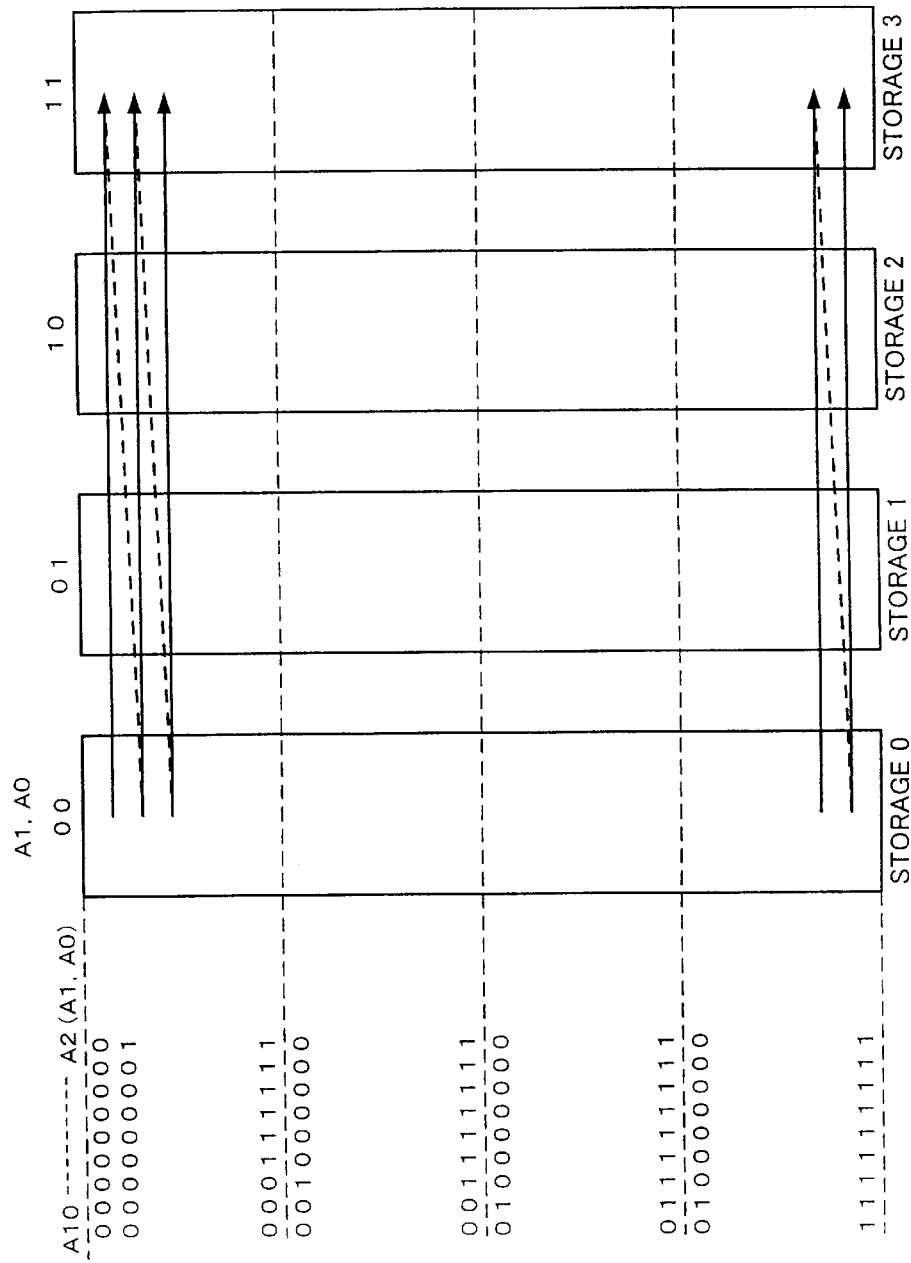
FIG. 10 is a schematic diagram for explaining the switching of storages in the embodiment of the invention.

An example of a storage switching method at the time of performing the parallel writing operation as mentioned above and reading out the written data will be described. FIG. 9 shows a construction for supplying addresses to four storages in the embodiment. FIG. 10 shows physical addresses in the flash memory of 4 MB×4=16 MB.

As described with reference to FIG. 4, the physical addresses are expressed by 11 bits of A0, A1, . . . , and A10. A0 indicates the LSB (least significant bit) and A10 shows the MSB (most significant bit).

In the embodiment of the invention, when the formed addresses A0 to A10 of 11 bits are sent to the flash memory, the addresses A2 to A10 are supplied to the flash memory as addresses for specifying the addresses of the sectors and segments. Two lower bits of A0 and A1 are supplied to the flash memory as addresses for specifying the storage switching. That is, as shown in FIG. 9, the addresses A2 to A10 of nine bits on the upper side are sent in common to the four storages (0 to 3). The addresses A0 and A1 of two bits on the lower side are supplied to a 2-to-4 decoder 40. Selection signals CS0, CS1, CS2, and CS3 for selecting each storage are generated from the decoder 40. When (A1, A0)=00, the selection signal CS0 to select the storage 0 is generated from the decoder 40. When (A1, A0)=01, (A1, A0)=10, or (A1, A0)=11, the selection signal CS1, CS2, or CS3 for selecting the storage 1, storage 2, or storage 3 is generated from the decoder 40, respectively. In the constructional example of FIG. 3, the decoder 40 is provided in the memory I/F, sequencer 17.

In case of performing the storage switching as mentioned above, an address change at the time when the physical address is increased from the address in which all 11 bits are equal to 0 to the address in which all 11 bits are equal to 1 is shown by arrows in FIG. 10. That is, the address change starts from the head cluster of the storage 0. Subsequently, the head cluster of the storage 1 is designated. When the address changes to the head cluster of the storage 3 via the head cluster of the storage 2, the physical cluster address changes so that the cluster is shifted to the second cluster of the storage 0.

Figures 11, 12:
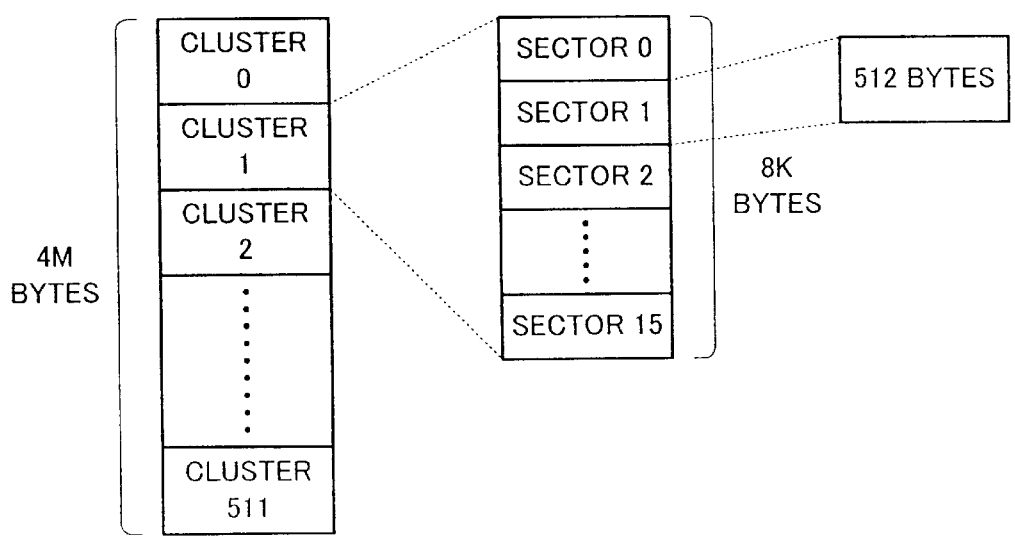
FIG. 11 is a schematic diagram showing the relation between segments and logic cluster addresses in the embodiment of the invention.
FIG. 12 is a schematic diagram showing a construction of an example of a flash memory to which the invention can be applied.

FIG. 11 shows an arrangement of the segments and the logic cluster addresses in the embodiment of the invention. As will be understood from the arrangement of the logic cluster addresses in FIG. 11, 512 clusters included in one segment are constructed by 128 clusters included in each of the four storages. The logical/physical address conversion table is formed every segment. Therefore, if no segment is changed, the logical/physical address conversion table to be referred to or updated is not changed, so that a deterioration of reading performance due to the access to the table or the updating of the table can be prevented. The data can be simultaneously written into the continuous logic cluster addresses, for example, 0x0004 to 0x0007.

When the logic cluster addresses are discontinuous like 0x0000, 0x0200, 0x0400, and 0x0600, since those addresses exist in one storage, the data cannot be simultaneously written. However, since a probability that the process for writing the continuous logic sectors into such discontinuous cluster addresses is very low, a large problem will not occur.

Although the embodiment has been described above with respect to the flash memory of 4 MB in which one sector consists of 512 B, one cluster consists of 8 kbytes, and one storage consists of 512 clusters, those values are shown as an example and the invention can be also applied to flash memories of other numerical values. For example, the capacity of one cluster can be set to 16 kB. The invention can be also applied to a flash memory such that a capacity of one storage is equal to 8 MB (1024 clusters×8 kB), 16 MB (1024 clusters×16 kB), 32 MB (2048 clusters×16 kB), 64 MB (4096 clusters×16 kB), or the like.

According to the invention, since each cluster is not distributed to a plurality of storages and the parallel recording is performed so that the sectors are continuously arranged in each cluster, the performance of the writing process is improved and the compatibility of the file format with that of the existing flash memory can be held.

What is claimed is:

1. A recording system having a detachable memory apparatus with a non-volatile memory formed of a plurality of clusters each having a plurality of sectors, and a data recording apparatus for recording data constructed by a plurality of continuous sectors into said memory apparatus, comprising:

address designating means for designating an address of the sector for recording the data; and recording means for recording the data into the sector designated by said address designating means, wherein said address designating means designates a plurality of sector addresses and designates the addresses so that said continuous sectors of said recording data are recorded as continuous sectors in said cluster, and said recording means simultaneously records the data into said plurality of sectors.

2. A data recording apparatus using a detachable memory apparatus including a non-volatile memory as a recording medium, comprising;

an address designator for recording data in a plurality of sectors into said memory apparatus in parallel, wherein said address designator designates a plurality of sector addresses and designates the addresses so that continuous sectors of said recording data are recorded as sectors which are continuous in a cluster.

3. A memory apparatus which is detachable to/from a data recording apparatus, comprising:

a non-volatile memory;

recording means for recording data; and interface means arranged between said data recording apparatus and said non-volatile memory, wherein said recording means simultaneously records the data into a plurality of sectors so that continuous sectors of said recording data are recorded as sectors which are continuous in a cluster.

4. A memory apparatus according to claim 3, further comprising address designating means for designating an address in which said recording means records the data.

5. A memory apparatus according to claim 3, wherein a plurality of data having offsets of the number which is equal to the number of sectors of the cluster is converted into parallel data and said parallel data is simultaneously written into a plurality of storages.

* * * * *